(12) United States Patent
Berg

(10) Patent No.: US 7,714,681 B2
(45) Date of Patent: May 11, 2010

(54) RECONFIGURABLE PHASE-SHIFTER

(75) Inventor: Håkan Berg, Göteborg (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 0 days.

(21) Appl. No.: 11/915,072

(22) PCT Filed: Jun. 10, 2005

(86) PCT No.: PCT/SE2005/000886

§ 371 (c)(1),
(2), (4) Date: Jan. 31, 2008

(87) PCT Pub. No.: WO2006/132574

PCT Pub. Date: Dec. 14, 2006

(65) Prior Publication Data

US 2008/0197936 A1 Aug. 21, 2008

(51) Int. Cl.
*H03H 7/20* (2006.01)
(52) U.S. Cl. .................. 333/139; 333/164; 333/169; 333/5
(58) Field of Classification Search .............. 333/164, 333/139, 169, 4, 5
See application file for complete search history.

(56) References Cited

U.S. PATENT DOCUMENTS

| 3,718,873 A | * | 2/1973 | Garver ..................... 333/164 |
| 4,581,595 A | * | 4/1986 | Silagi ....................... 333/139 |
| 4,616,196 A |   | 10/1986 | Sharma |
| 5,680,079 A | * | 10/1997 | Inami et al. ................ 333/161 |

FOREIGN PATENT DOCUMENTS

EP 1322038 6/2003

OTHER PUBLICATIONS

D.Adler, et al. "Broadband Switched-Bit Phase Shifter Using All-Pass Networks," 1991 IEEE MTT-S International Microwave Symposium Digest; pp. 265-268.

* cited by examiner

*Primary Examiner*—Benny Lee
(74) *Attorney, Agent, or Firm*—Michael G. Cameron

(57) ABSTRACT

A phase shifter device having two bandwidth modes arranged for altering the electrical length of a signal path between at least two different values, which device is adapted for guiding a signal through at least one of at least a first signal path having a first phase and amplitude filter characteristics for varying frequency of the signal, and a second signal path, having a second phase and amplitude filter characteristics for varying frequency of the signal. At least one of said first and second phase and amplitude filter characteristics is realized by means of an all-pass filter.

1 Claim, 8 Drawing Sheets

RECONFIGURABLE PHASE-SHIFTER

TECHNICAL FIELD

The present invention relates to a phase shifter device arranged for altering the electrical length of a signal path between at least two different values, the device being adapted for guiding a signal through at least one of at least a first signal path, having a first phase and amplitude filter characteristics for varying frequency of the signal, and a second signal path, having a second phase and amplitude filter characteristics for varying frequency of the signal.

The present invention also relates to phase shifter according to the above, where each signal path has a certain bandwidth, and where the first signal path essentially lacks bandwidth limitations concerning amplitude and the second signal path has bandwidth limitations concerning amplitude, where the presence of limitation in bandwidth is defined as whether a bandwidth of a system in which the phase shifter device is used is affected or not.

BACKGROUND ART

In many fields of signal processing, it is of interest to include discrete phase shifters in order to change the electrical length of the signal path. These phase shifters are controllable, allowing two or more different lengths of the signal paths to be obtained.

Many fields of use are conceivable for such discrete phase shifters, mainly for applications where the frequency ranges from radio frequencies to microwave frequencies. They may for example be used in signal mixers and digital radio devices.

One particular field of use for phase shifters is active electrically controlled antennas. For such antennas, it is possible to control the antenna radiation pattern, i.e. it is possible to direct the main lobe at a desired angle and to acquire desired side-lobe levels within certain limitations. For example, it could be desired to create a very low degree of antenna coverage at a certain angle as a source of disturbance is present there, at the same time as the main lobe is directed at an angle where a desired receiver or transmitter is present. These antennas are for example used in mobile telephone systems or in radar equipment.

Such an antenna is preferably in the form of an array antenna comprising a number of antenna elements. Each one of these antenna elements in the array antenna is individually fed with a signal having a certain phase relative to the other antenna elements. By varying the relative phase between the antenna elements, the controllable features described above are possible to obtain.

For each antenna element, the signal fed into the array antenna passes a phase shifter before reaching a certain antenna element, where the phase shifter is controlled to constitute a certain signal path length relative to the other antenna elements.

Today, it is common to construct the phase shifters using MMIC (Monolithic Microwave Integrated Circuit) technology. These phase shifters are usually realized using a combination of high-pass and low-pass filters, where these filters create two branches between which the signal can be switched in order to achieve one of two possible relative phase differences between the two branches. This is shown in the prior art FIG. 1a, where a phase shifter 1 has a left-hand branch 2 that comprises a low-pass filter 3 with a first grounded capacitor 4 and second grounded capacitor 5 and a series inductor 6. A right-hand branch 7 of the phase shifter 1 comprises a high-pass filter 8 with a second grounded inductor 9 and a third series capacitor 10 and a fourth series capacitor 11. By means of a first switch 12 and a second switch 13, it is possible to either choose the left-hand branch 2 and the low-pass filter 3 or the right-hand branch 7 with the high-pass filter 8. The switches are connected to a first phase shifter connection point 14 and second phase shifter connection point 15.

In the FIGS. 1b and 1c, phase and amplitude characteristics are shown over frequency. The low-pass filter 3 has the phase characteristics shown with a solid line 16 in FIG. 1b and the amplitude characteristics shown with a solid line 17 in FIG. 1c. The high-pass filter has the phase characteristics shown with a dotted line 18 in FIG. 1b and the amplitude characteristics shown with a dotted line 19 in FIG. 1c. The phases φ (FIG. 1b) and amplitudes A (FIG. 1c) are represented on the y-axis, and the frequency f on the x-axis.

As evident from FIG. 1b, it is possible to acquire a sufficiently constant phase difference D between the filters 3, 8 when the frequency is changed, i.e. the phase difference D is quite broad banded. The value of the phase difference D is possible to adjust by means of the adjustments to the values of the components 4, 5, 6; 9, 10, 11 in the filters 3, 8. The phase performance over frequency is thus not a limiting factor for the function of the phase shifter 1.

As evident from FIG. 1c, however, the pass bands more or less overlap only at a narrow band B. At this narrow band B, the amplitude performance allows the phase shifter to function adequately, but outside the band B the phase shifter performance is not acceptable. The amplitude performance over frequency is thus a limiting factor for the function of the phase shifter 1. This is a problem, since although limited bandwidth of the phase performance may be compensated for by means of calibration methods, this is not feasible for limited bandwidth of the amplitude performance.

As shown in FIG. 2, a number of phase shifter elements 1a, 1b as seen in FIG. 1a, may be serially connected into a cascaded total phase shifter 20, each having a phase difference between the respective branches. This phase length difference is preferably of different values for each phase shifter elements 1a, 1b, allowing a more or less fine tuning of the total phase depending on the number of phase shifter elements in the cascaded total phase shifter 20. The path is chosen for the incoming signal by means of four switches S', S'', S''', S''''.

A variation of the phase shifter as described herein is to use so-called reconfigurable filters to realize the phase shift. In this way only one branch is needed, since both a high-pass filter and a low-pass filter can be realized, one at a time, by means of switches. Large components, such as coils, may be re-used, allowing a more efficient use of the layout. Such a configuration is shown in FIG. 3, where a phase shifter element 21 comprises a first grounded capacitor 22 and a second grounded capacitor 23, a third series capacitor 24 and a fourth series capacitor 25 and a coil 26. By means of a first switch 27, second switch 28, third switch 29 and fourth switch 30, either a low-pass filter or a high-pass filter may be realized between a first connection point 31 and second connection point 32. The current switch setting in FIG. 3 provides a low-pass filter.

These filters may also be cascaded as described previously, in order to allow a more or less fine tuning of the phase, depending on the number of cascaded filters constituting the cascaded total phase shifter.

Both the phase shifter configurations as described herein do, however, have some disadvantages. The switches are generally constituted by transistors, PIN-diodes, or other applicable devices such as MEMS (micro electromechanical systems). These switches comprise parasitics. The following describes the switches as being constituted by transistors, but the general principle is applicable for PIN-diodes and other applicable devices.

In FIGS. 4a and 4b, a switch transistor 33 of a known and widely used type is shown. The transistor 33 has a drain 34, a gate 35 and a source 36, and between the drain 34 and the source 36, a parasitic 37, 38 is present. If the transistor 33 is in an OFF-state, as shown in FIG. 4a, i.e. if the switch is open, a parasitic capacitor 37 is present. If the transistor 33 is in an ON-state, as shown in FIG. 4b, i.e. if the switch is closed, a parasitic resistor 38 is present. The smaller a transistor 33 is, the larger the resistor 38 becomes and the smaller the capacitor 37 becomes. The larger resistor 38 is responsible for losses in the ON-state. The larger a transistor 33 is, the smaller the resistor 38 becomes and the larger the capacitor 37 becomes. The larger capacitor 37 is responsible for leakage in the OFF-state.

Parasitics become more severe as more signal power passes through the switch. In an ON-state, the losses thus become larger, and in an OFF-state, the leakage becomes larger.

The disadvantage with parasitics is clearly evident for the phase shifter using two branches between which a switch is placed. See for example the branch switch 12 and second branch switch 13 in FIG. 1a. These switches 12, 13 are placed where the entire signal that is to be phase shifted passes, and are called serial switches since they are coupled in series with the main signal path. Therefore, the disadvantage with parasitics in the switches is clearly apparent in this case.

For a phase shifter using reconfigurable filters, branch switches are not used, since there is only one branch. Instead, as shown in FIG. 3, there are serial switches 27, 28, 29, 30 within the reconfigurable filters, through which switches 27, 28, 29, 30 all the signal that is to be phase shifted passes. Therefore, the disadvantage with parasitics in the switches is clearly apparent in this case also.

In some applications, it is desirable to use a phase shifter as a narrow-banded filter during initial verification procedures. Therefore, it is of interest to present a phase shifter that, in a first mode of operation, has such a bandwidth that it does not affect the bandwidth of the system in which the phase shifter is used in a negative manner, and, in a second mode of operation, may be used as a narrow-banded filter.

The main disadvantage with the previously known phase shifters 1, 21 is the previously mentioned limited bandwidth of the phase shifter amplitude performance. Furthermore, a cascaded total phase shifter 20 inevitably results in an even narrower band where the phase shifting may work adequately, since the phase shifting elements, each having a narrow overlap band, do not have exactly the same narrow overlap band. This results in an even narrower total overlap band. In other words, as the resolution of the total phase shifter is increased, the bandwidth is decreased. As described above, limited bandwidth of the amplitude performance is not possible to compensate for by means of calibration methods.

There is thus a need for a phase shifter that, has such a bandwidth that it does not affect the bandwidth of a system in which the phase shifter is used.

SUMMARY OF THE INVENTION

The objective problem that is solved by the present invention is to provide a phase shifter that has such a bandwidth that it does not affect the bandwidth of the system in which the phase shifter is used.

This problem is solved by the present invention. The invention is further characterized in that at least one of said first and second phase and amplitude filter characteristics is realized by means of an all-pass filter.

The main advantage that is acquired by means of the present invention is that a phase shifter, having such a bandwidth that it does not affect the bandwidth of the system in which the phase shifter is used, is acquired.

Preferred embodiments are apparent from the dependent claims. Where a reconfigurable phase shifter is used, the switch parasitics may be compensated for.

Furthermore, the invention is also characterized in that one of the at least first and second phase and amplitude filter characteristics is realized by means of an all-pass filter, and the other one of the at least first and second phase and amplitude filter characteristics is realized by means of at least one of: a band-pass filter, a low-pass-filter, a high-pass filter or a band-stop filter.

Where the device according to the invention comprises a first signal path having the characteristics of an all-pass filter and a second signal path having the characteristics of a band-pass filter, a low-pass-filter, a high-pass filter or a band-stop filter, two bandwidth modes are possible to achieve. When the first signal path having the characteristics of an alt-pass filter is activated, the device presents a bandwidth that does not affect the bandwidth of a system in which the phase shifter is used. When the second signal path, having the characteristics of at least one of a band-pass filter, a low-pass-filter, a high-pass filter or a band-stop fitter is activated, the device functions as a narrow-banded filter.

This embodiment thus enables two modes of operation; a broad band mode and a narrow-band mode.

BRIEF DESCRIPTION OF THE DRAWINGS

The invention will now be described more in detail with reference to the appended drawings, where.

DETAILED DESCRIPTION

Figure 1A:
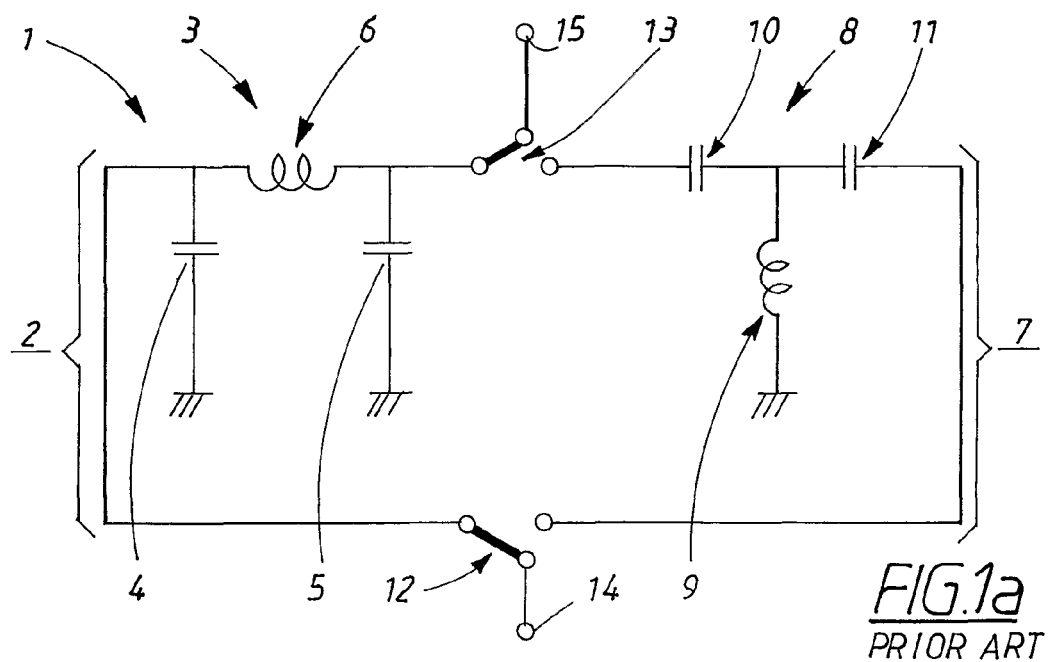
FIG. 1a shows a prior art phase shifter element.
Figure 1B:
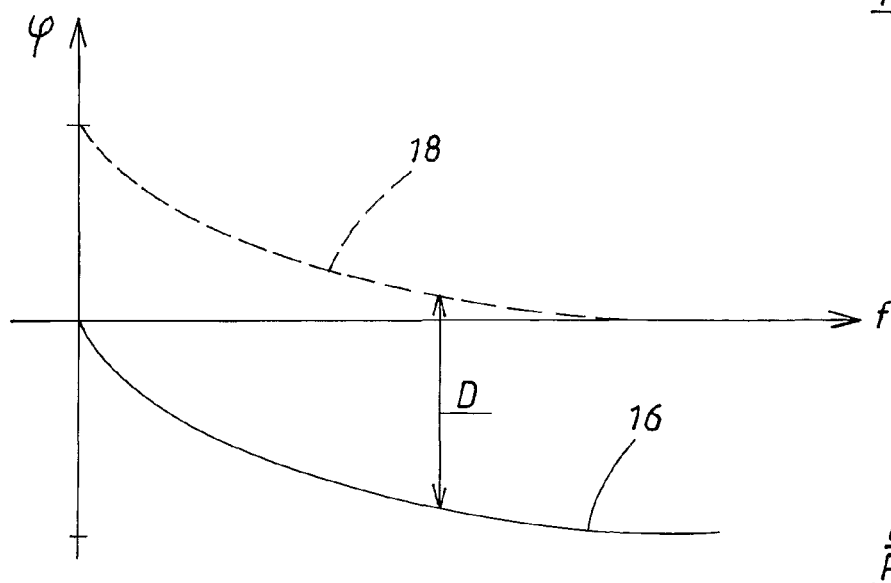
FIG. 1b shows phase characteristics for the phase shifter element according to FIG. 1.
Figure 1C:
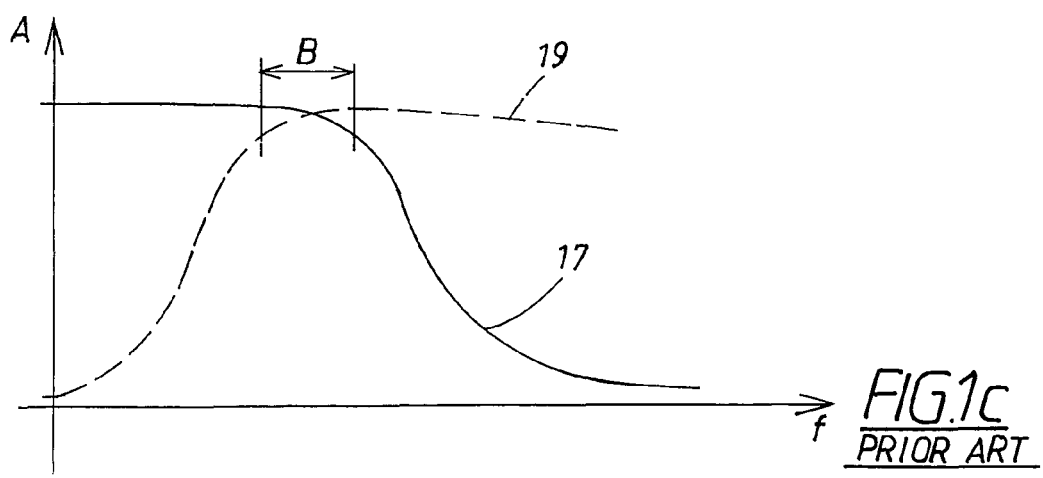
FIG. 1c shows amplitude characteristics for the phase shifter element according to FIG. 1.
Figure 2:
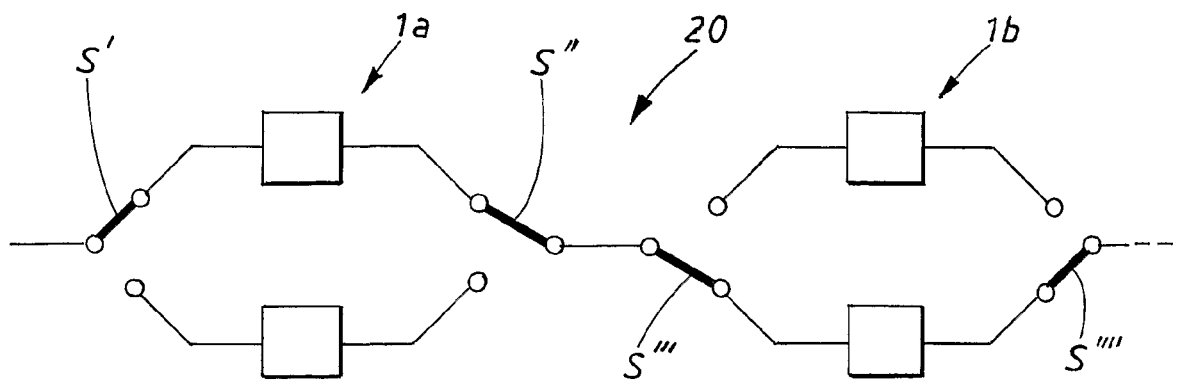
FIG. 2 shows cascaded phase shifter elements according to FIG. 1.
Figure 3:
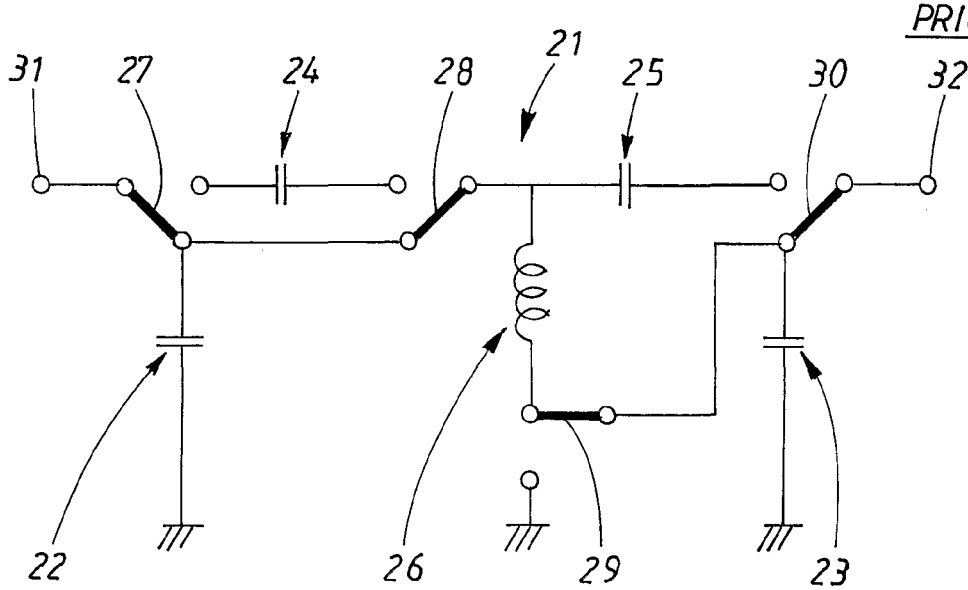
FIG. 3 shows a re-configurable version of the phase shifter element according to FIG. 1.
Figure 4A:
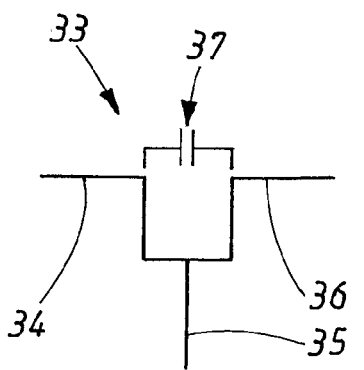
FIG. 4a shows a switch transistor in an OFF-state.
Figure 4B:
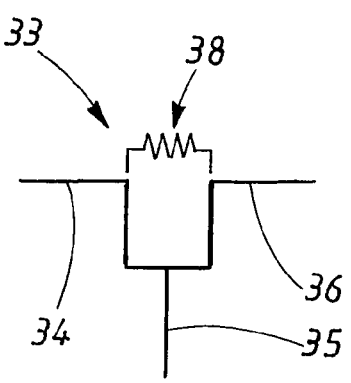
FIG. 4b shows a switch transistor in an ON-state.
Figure 5:
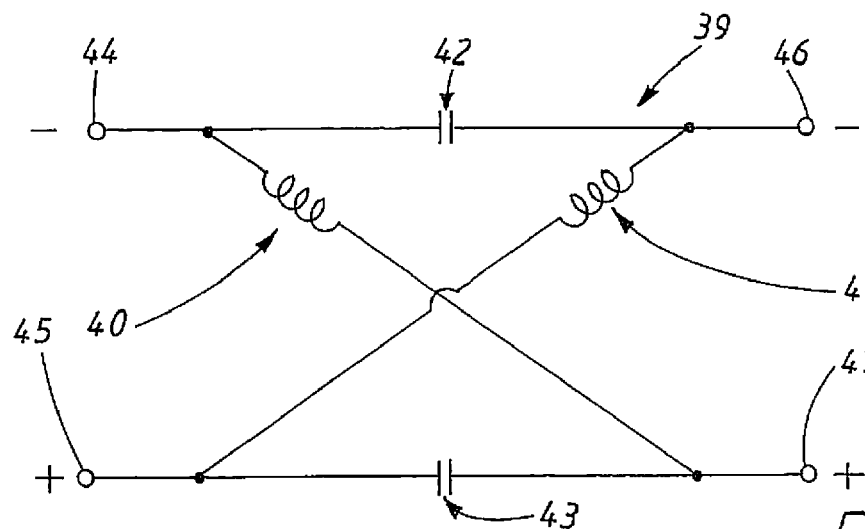
FIG. 5 shows an all-pass filter as used for the present invention.

A so-called all-pass filter 39 is shown in FIG. 5. The all-pass filter 39 comprises a first inductor 40 and second inductor 41 and a first capacitor 42 and second capacitor 43. In order to obtain an all-pass filter, it is necessary to use a so-called differential signal, i.e. a signal which has positive potential and a negative potential in two different signal conductors, using no ground plane. These potentials constitute a positive and a negative terminal used for the following embodiments.

The all-pass filter thus has a negative (−) 44 and positive (+) 45 input terminal, and a negative (−) 46 and positive (+) 47 output terminal. The first capacitor 42 is connected in series with the negative (−) input and output terminals 44 and 46, and the second capacitor 43 is connected in series with the positive (+) input and output terminals 45 and 47. The first inductor 40 is connected between the negative (−) input terminal 44 and the positive (+) output terminal 47, and the second inductor 41 is connected between the positive (+) input terminal 45 and the negative (−) output terminal 46.

Figure 6A:
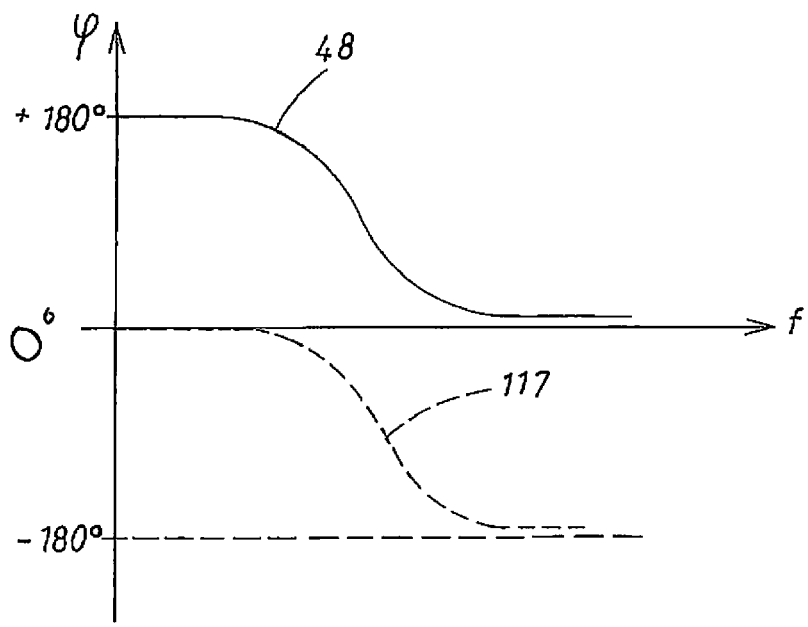
FIG. 6a shows phase characteristics for the all-pass filter according to FIG. 5.
Figure 6B:
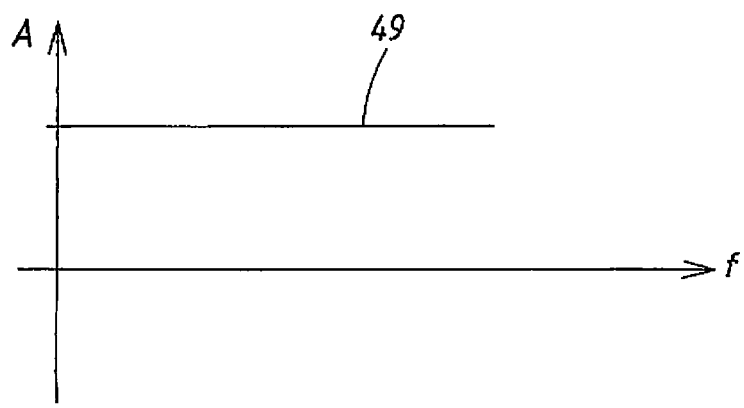
FIG. 6b shows amplitude characteristics for the all-pass filter according to FIG. 5.

The all-pass filter 39 has the phase characteristics shown with a solid line 48 in FIG. 6a and the amplitude characteristics shown with a solid line 49 in FIG. 6b. The phase $\phi$ (FIG. 6a) and amplitude A (FIG. 6b) is represented on the respective y-axis, and the frequency f on the respective x-axis.

As evident in FIGS. 6a and 6b, the amplitude is ideally constant over frequency, i.e. ideally independent of the frequency used, and the phase shifts from 180° at low frequencies to 0° at high frequencies. The nature of the phase shift; where it takes place and its slope, is defined by the values of the components. For real filters there are, of course, deviations from the ideal case, resulting in that the amplitude is essentially constant over frequency.

Figure 7:
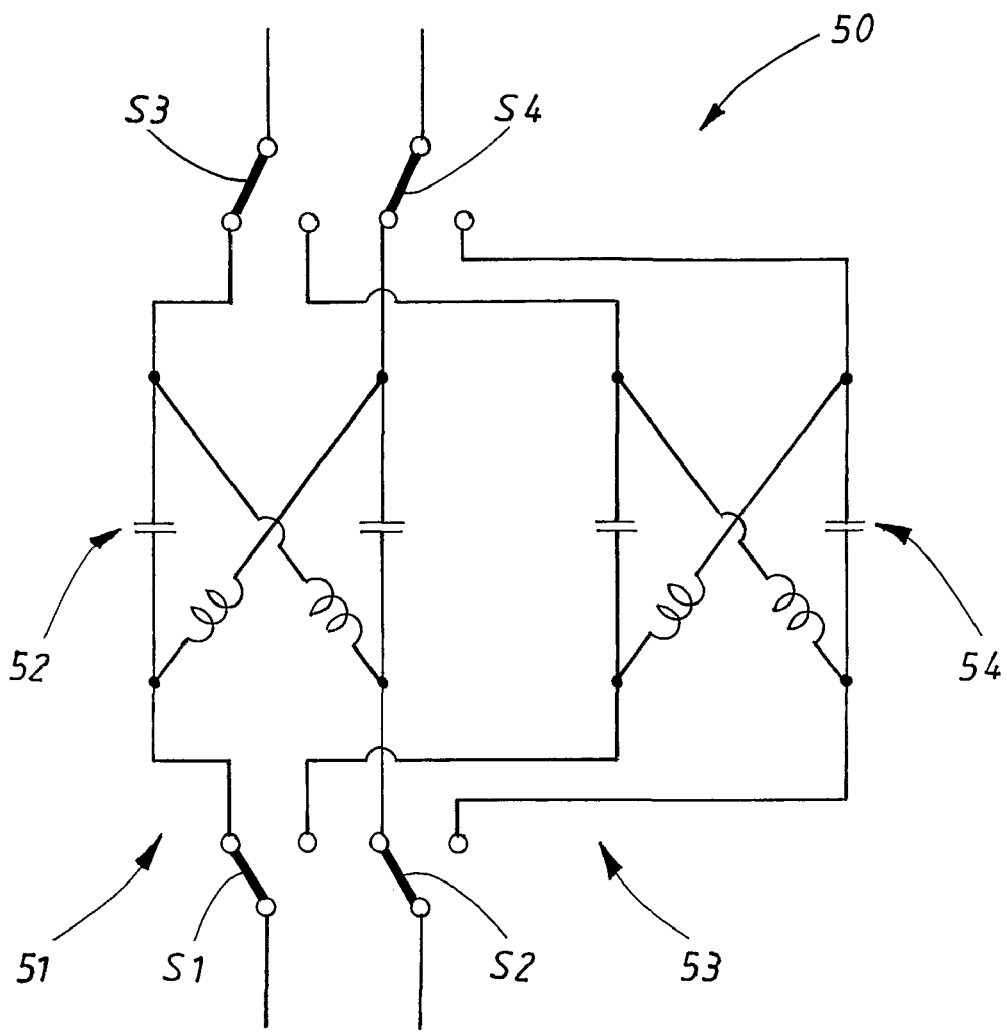
FIG. 7 shows a phase shifter element according to a first embodiment of the present invention.

As shown in FIG. 7, a phase shifter element 50 according to a first embodiment of the present invention has a left-hand branch 51 that comprises a first all-pass filter 52 and a right-hand branch 53 that comprises a second all-pass filter 54. In other words, each branch 51, 53 constitutes a signal path having a respective phase and amplitude filter characteristics. Each phase and amplitude filter characteristics is realized by means of an all-pass filter 52, 54.

Either the first all-pass filter 52 or the second all-pass filter 54 is chosen for the incoming signal by means of switches S1, S2, S3, S4. In FIG. 7, the switches S1, S2, S3, S4 are set for guiding the incoming signal through the left-hand branch 51.

Figure 8:
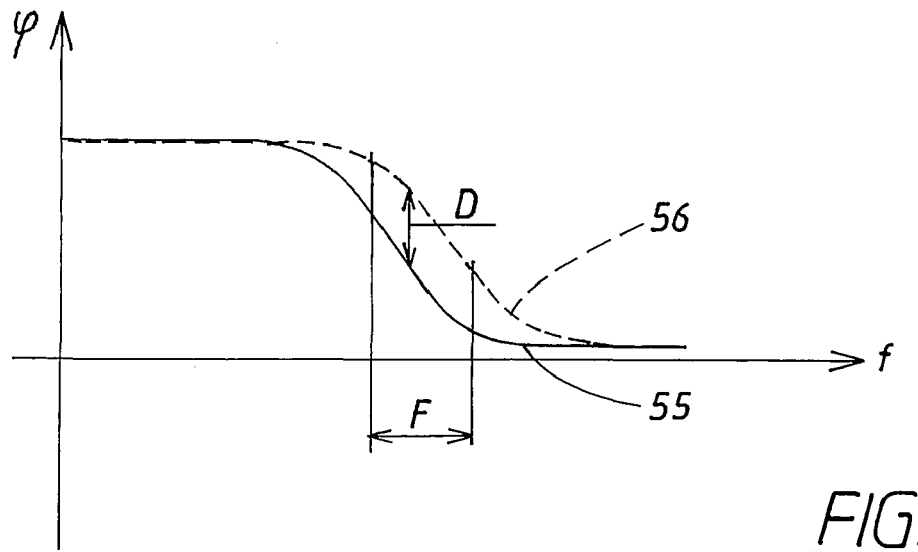
FIG. 8 shows phase characteristics for the phase shifter element according to FIG. 7.

The first all-pass filter has the frequency characteristics shown with a solid line 55 in FIG. 8 and the second all-pass filter has the frequency characteristics shown with a dotted line 56 in FIG. 8. The phases $\phi$ are represented on the y-axis and the frequency f on the x-axis. As evident from FIG. 8, the phase of all-pass filters have different frequency characteristics. This difference in frequency characteristics is, as mentioned above, obtained by using different values for the components used.

The phase shifter element 50 is used in a frequency interval F where there is a difference D in phase characteristics between the all-pass filters and where this difference D is essentially constant. In practice, the phase difference D will, however, vary slightly in this frequency interval F. This varying is more or less known, and is therefore compensated for, preferably by means of appropriate calibration procedures.

This frequency interval F where the phase shifter element 50 according to FIG. 7 is usable is broader and more stable than those of prior art. This is advantageous, since a number of phase shifter elements 50 according to FIG. 7 may be serially connected into a cascaded total phase shifter, each having a phase difference D between the branches. These phase differences D are preferably of different values, allowing a more or less fine tuning of the total phase depending on the number of phase shifter elements in the cascaded total phase shifter. Since the amplitude does not vary much over frequency, the amplitude performance does not offer any bandwidth limitations.

Figure 9:
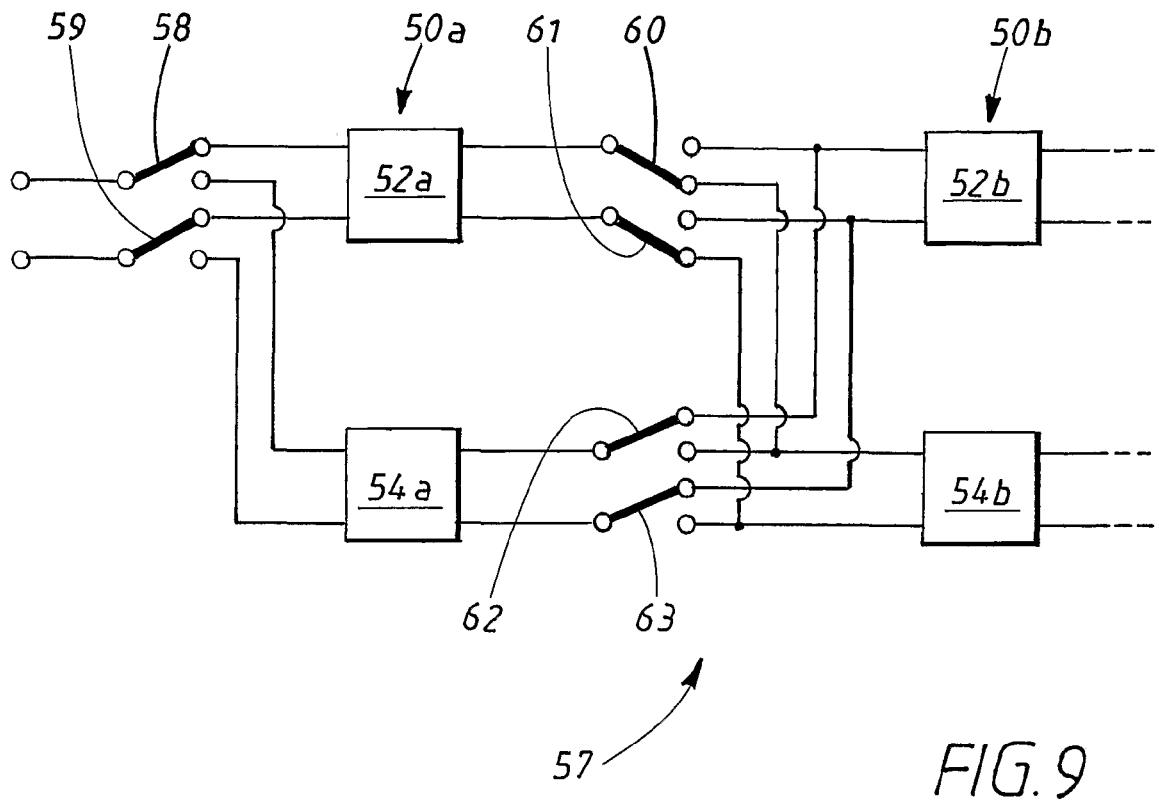
FIG. 9 shows cascaded phase shifter elements according to FIG. 8.

As shown in FIG. 9, a first phase shifter element 50a comprises a first all-pass filter 52a and a second all-pass filter 54a. This first phase shifter element 50a is cascaded with a second phase shifter element 50b, comprising a third all-pass filter 52b and a fourth all-pass filter 54b. The possible use of more cascaded phase shifter elements is indicated by dotted lines, all the cascaded phase shifter elements 50a, 50b constitute a combined total phase shifter 57. Due to the differential signal that is used, negative conductors and positive conductors have to be utilized. In order to obtain a proper switching function, there has to be a switch for every conductor. This is described more in detail below.

The incoming differential signal is switched to either the first all-pass filter 52a or the second all-pass filter 54a by means of a first switch 58 and second switch 59. The outgoing differential signal from the first all-pass filter 52a is switched to either the third all-pass filter 52b or the fourth all-pass filter 54b by means of a third switch 60 and fourth switch 61. The outgoing differential signal from the second all-pass filter 54a is switched to either the third all-pass filter 52b or fourth all-pass filter 54b by means of a fifth switch 62 and sixth switch 63. In FIG. 9, the current setting of the switches 58, 59, 60, 61, 62, 63 first guides the incoming signal to the first all-pass filter 52a and then to the fourth all-pass filter 54b.

This phase length difference between the all-pass filters 52a, 54a; 52b, 54b in each phase shifter element 50a; 50b is preferably of different values for the cascaded phase shifter elements 50a, 50b, allowing a more or less fine tuning of the total phase depending on the number of phase shifter elements in the cascaded total phase shifter 57.

Figure 10:
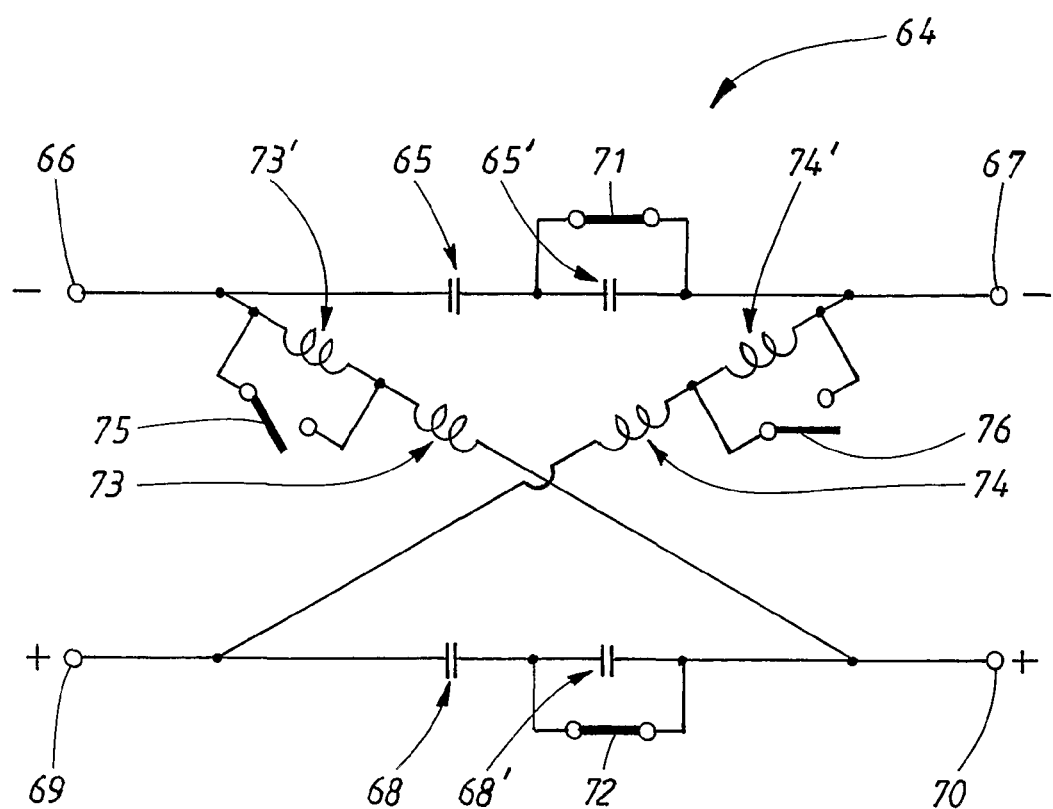
FIG. 10 shows a re-configurable version of the phase shifter element according to FIG. 7, constituting a second embodiment of the present invention.

In FIG. 10, a phase shifter element 64 according to a second embodiment of the present invention is shown. Here, an all-pass filter is realized as a reconfigurable filter. In this way only one branch is needed, since a first and second all-pass filter can be realized, one at a time, by means of switches. In other words, by means of the switches, two signal paths, each having a respective phase and amplitude filter characteristics, are obtained. The phase and amplitude filter characteristics are realized by means of a re-configurable all-pass filter, which reconfigurable all-pass filter works as two separate all-pass filters, one at a time.

The reconfigurable all-pass filter comprises the same type of components as the ones described with reference to FIG. 5, with the exception that each component is coupled in series with another component of the same type. These serial components are, however, possible to by-pass by means of switches.

More in detail, a first capacitor 65 is connected in series with a negative (−) input terminal 66 and negative (−) output terminal 67, and a second capacitor 68 is connected in series with the positive (+) input terminal 69 and positive (+) output terminal 70. These capacitors 65, 68 are each connected in series with a first and second sub-capacitor 65', 68', respectively, which sub-capacitors 65', 68' are coupled in parallel with a respective first capacitor switch 71, and second capacitor switch 72 that may by pass the sub-capacitors 65', 68'.

Further, a first inductor 73 is connected between the negative (−) input terminal 66 and the positive (+) output terminal 70, and a second inductor 74 is connected between the positive (+) input terminal 69 and the negative (−) output terminal 67. These inductors 73, 74 are each connected in series with a sub-inductor 73' and a second sub-inductor 74', which sub-inductors 73', 74' are coupled in parallel with a respective first inductor switch 75 and second inductor switch 76 that may by pass the sub-inductors 73', 74'.

The sub-capacitors 65', 68' and sub-inductors 73', 74' are thus either electrically coupled in series with the corresponding first and second capacitors 65, 68 and inductors 73, 74, or by-passed, depending on the switch state.

By means of the switches 71, 72, 75, 76, either capacitor/inductor branch may attain one of two possible capacitance/inductance values. The switches may for example be realized by means of transistors or PIN-diodes. An advantage of this embodiment compared with the previous one according to FIG. 7, is that the switches S1, S2, S3, S4 used in the embodiment according to FIG. 7 are not needed. Instead, in the second embodiment, there is a first capacitor switch 71 and a second capacitor switch 72, which are serial switches. These switches are coupled in parallel with the first and second sub-capacitor 65', 68'. This means that the switch parasitic capacitors of the first capacitor switch 71 and second capacitor switch 72 affect the phase shifter 64 to a very small extent, since the first and second sub-capacitor 65', 68' have a much larger capacitance than the switch parasitic capacitors of the first capacitor switch 71 and second capacitor switch 72.

This reconfigurable filter, which constitutes a phase shifter element 64, is preferably cascaded in a similar manner as described with reference to FIG. 9.

Figure 11:
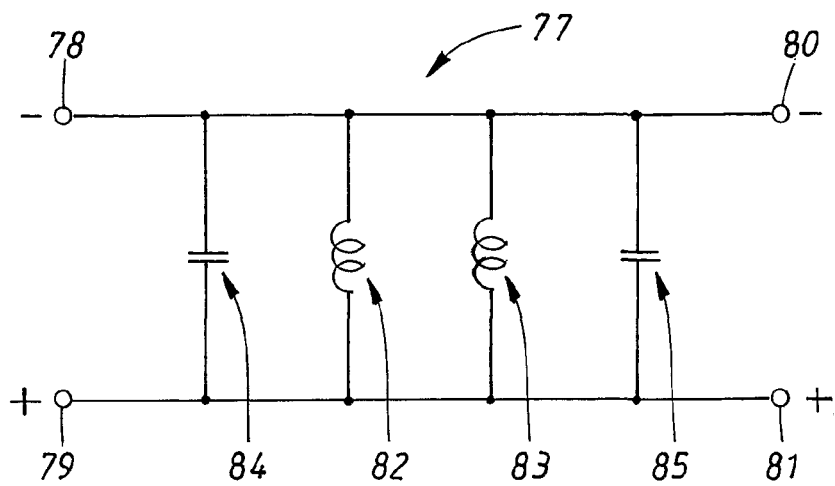
FIG. 11 shows a band-pass filter.

A third embodiment of the present invention comprises a so-called band-pass filter 77, which is shown in FIG. 11. The band-pass filter 77 is adapted for a differential signal, and thus has a negative (−) input terminal 78 and positive (+) input terminal 79 and a negative (−) output terminal 80 and positive (+) output terminal 81. The negative (−) input terminal 78 is connected to the negative (−) output terminal 80, and the positive (+) input terminal 79 is connected to the positive (+) output terminal 81. The band-pass filter 77 further comprises a first inductor 82 and second inductor 83 and a first capacitor 84 and second capacitor 85, each component 82, 83, 84, 85 being connected in parallel between the negative (−) terminals 78, 80 and positive (+) terminals 79, 81.

Figure 12A:
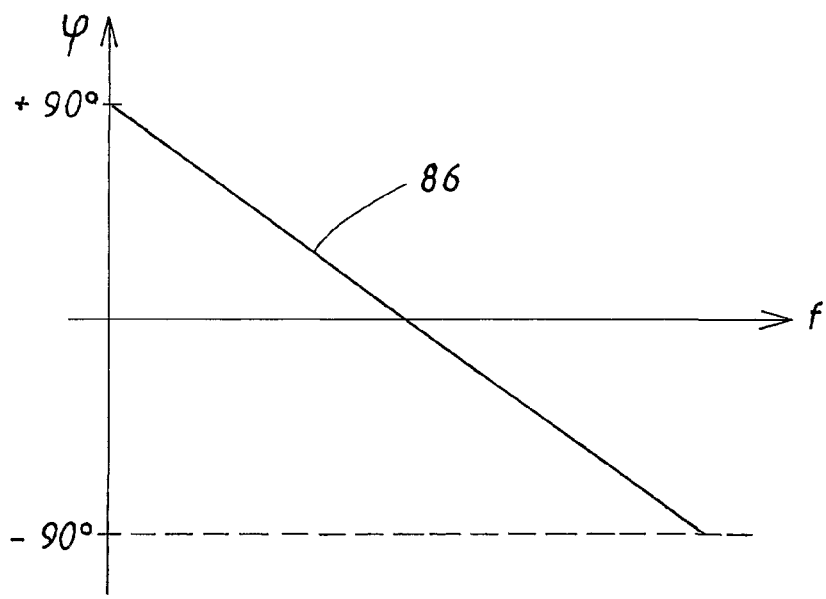
FIG. 12a shows phase characteristics for the band-pass filter according to FIG. 11.
Figure 12B:
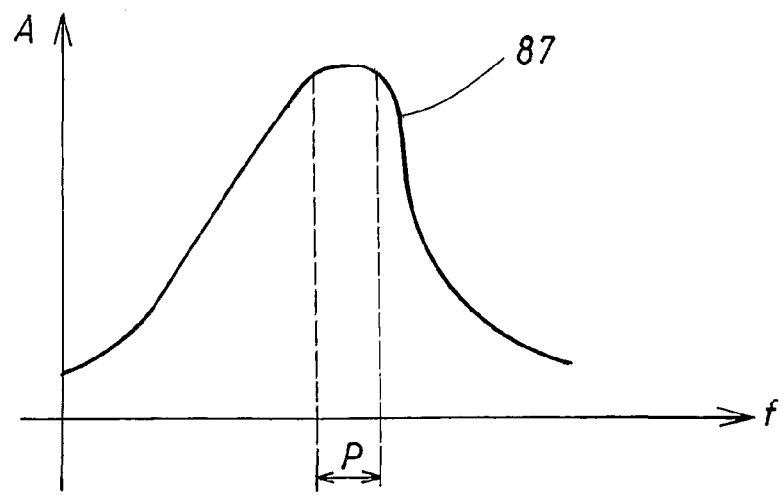
FIG. 12b shows amplitude characteristics for the band-pass filter according to FIG. 11.

The band-pass filter has the phase characteristics shown with a solid line 86 in FIG. 12a and the amplitude characteristics shown with a solid line 87 in FIG. 12b. The phase φ (FIG. 12a) and amplitude A (FIG. 12b) is represented on the respective y-axis, and the frequency f on the respective x-axis.

As evident in FIGS. 12a and 12b, the amplitude has a so-called pass-band P (FIG. 12b), which is essentially flat, which pass-band P has a certain band-width. The phase shifts from +90° at low frequencies to −90° at high frequencies as shown in FIG. 12a. The nature of the phase shift; where it takes place and its slope, is defined by the values of the components.

Figure 13:
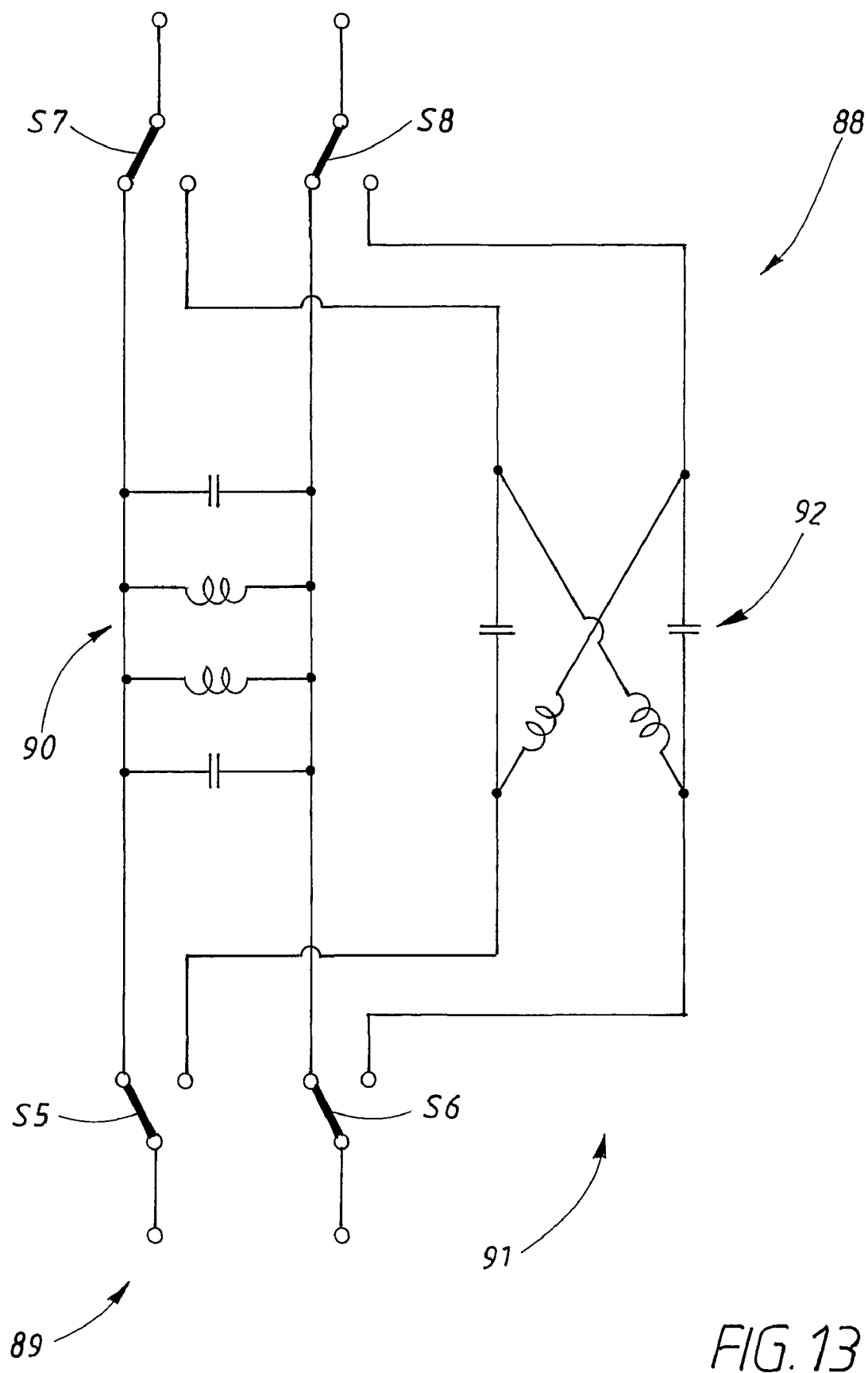
FIG. 13 shows a phase shifter element according to a third embodiment of the present invention.

As shown in FIG. 13, a phase shifter element 88 according to the third embodiment of the present invention has a left-hand branch 89 that comprises a band-pass filter 90 and a right-hand branch 91 that comprises an all-pass filter 92. In other words, each branch 89, 91 constitutes a signal path having a respective phase and amplitude filter characteristics. The phase and amplitude filter characteristics for the respective signal paths are realized by means of a band-pass filter 90 and an all-pass filter 92.

Either the band-pass filter 90 or the all-pass filter 92 is chosen for the incoming signal by means of switches S5, S6, S7, S8. In FIG. 13, the switches S5, S6, S7, S8 are set for guiding the incoming signal through the left-hand branch 90.

The all-pass filter has the frequency characteristics shown in FIG. 8. As evident from FIG. 12 and FIG. 8, the phases of the band-pass and all-pass filter have different frequency characteristics. The nature of this difference in frequency characteristics is controlled by using different values for the components used.

The phase shifter element uses the difference in phase characteristics between the band-pass and all-pass filter in the way previously described for the previous embodiments. Several phase shifter elements are preferably cascaded into a total phase shifter in a similar manner as described with reference to FIG. 9.

The use of a band-pass filter in the phase shifter elements is advantageous since all switches in the total phase shifter may be set in such a way that only all the band-pass filters are engaged. This mode of operation is especially used during verification procedures, when it is desired to use the total phase shifter as a narrow-banded filter instead.

More in detail, two signal paths 89, 91 are obtained, where each path 89, 91 has a certain bandwidth. The first path 89 essentially lacks bandwidth limitations concerning amplitude and the second path 91 has bandwidth limitations concerning amplitude, where the presence of limitation in bandwidth is defined as whether a bandwidth of a system in which the phase shifter device 88, 93 is used is affected or not. When a total phase shifter is set in such a way that only all the band-pass filters are engaged, the total phase shifter works as a narrow-banded filter which for example, as mentioned above, is advantageous during verification procedures.

Figure 14:
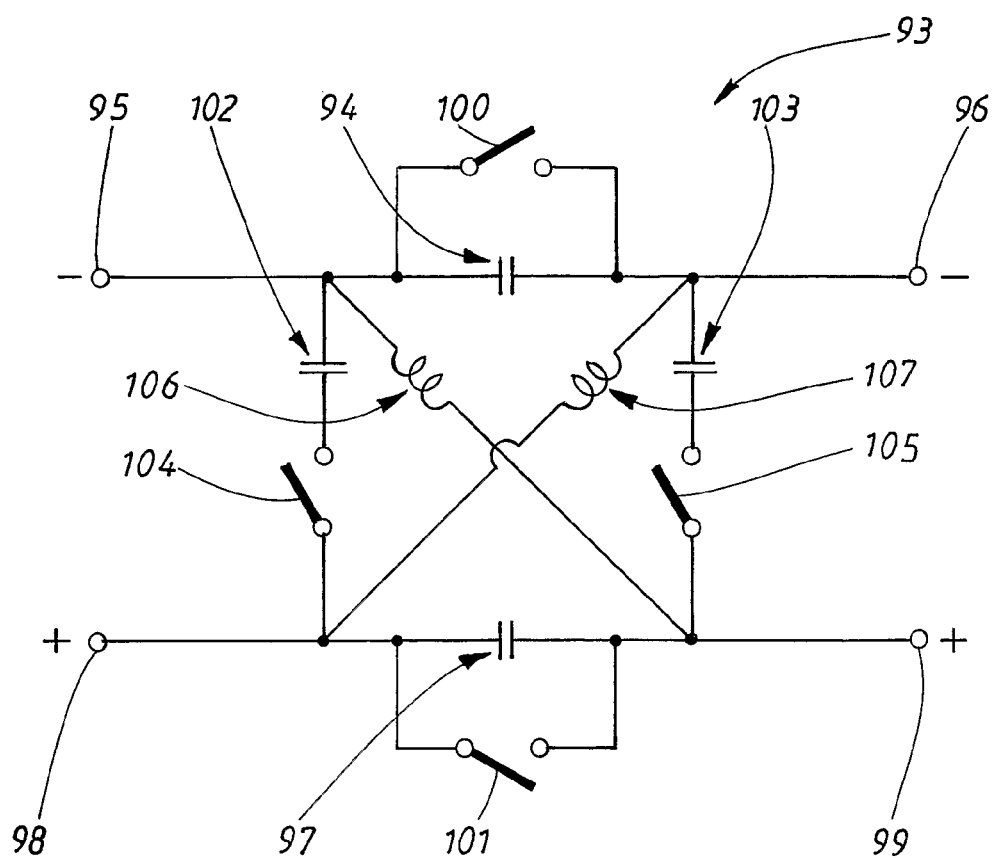
FIG. 14 shows a re-configurable version of the phase shifter element according to FIG. 13, constituting a fourth embodiment of the present invention.

In FIG. 14, a phase shifter element 93 according to a fourth embodiment of the present invention is shown. Here, a phase shifter element comprising a band-pass filter and an all-pass filter is realized as a reconfigurable filter. In this way only one branch is needed, since the band-pass and all-pass filter can be realized, one at a time, by means of switches.

In other words, by means of the switches, two signal paths, each having a respective phase and amplitude filter characteristics, are obtained. The phase and amplitude filter characteristics are realized by means of a re-configurable filter, which re-configurable filter either works as a band-pass filter or an all-pass filter depending on the setting of the switches.

More in detail, a first capacitor 94 is connected in series with a negative (−) input terminal 95 and a negative (−) output terminal 96, and a second capacitor 97 is connected in series with a positive (+) input terminal 98 and a positive (+) output terminal 99. These capacitors 94, 97 may be by-passed by means of a respective first 100 switch and second 101 switch.

A third capacitor 102 is connected at between the input terminals 95, 98 and a fourth capacitor 103 is connected between the output terminals 96, 99, the third capacitor 102 and fourth capacitor 103 having the first capacitor 94 and second capacitor 97 positioned between them. The third capacitor 102 and fourth capacitor 103 may be included in, or excluded from, the re-configurable filter 93 by means of a third switch 104 and fourth switch 105. The third switch 104 is connected in series with the third capacitor 102, and the fourth switch 105 is connected in series with the fourth capacitor 103.

Further, a first inductor 106 is connected between the negative (−) input terminal 95 and the positive (+) output terminal 99, and a second inductor 107 is connected between the positive (+) input terminal 98 and the negative (−) output terminal 96.

When the switches 100, 101, 104, 105 are closed, a band-pass filter is obtained. When the switches 100, 101, 104, 105 are opened, as shown in FIG. 14, an all-pass filter is obtained. The switches may for example be realized by means of transistors or PIN-diodes. The switch parasitic capacitors of the first switch 100 and second switch 101 affect the phase shifter 93 to a very small extent, by the same reasons as described with reference to FIG. 10.

This reconfigurable filter 93, which constitutes a phase shifter element, uses the difference in phase characteristics between the band-pass and all-pass filter in the way previously described. Several phase shifter elements are preferably cascaded in a similar manner as described with reference to FIG. 9.

As a summary of the characteristic features and advantages of the present invention, the following may be stated.

The basic principle of the invention is that it constitutes a phase shifter device which is constituted by at least two branches, constituting at least two signal paths, each signal path having a respective phase and amplitude filter characteristics for varying frequency of the signal. At least one of said first and second phase and amplitude filter characteristics is realized by means of an all-pass filter.

By choosing a type where the at least two branches each comprise a filter of the type all-pass filter, a broader and more stable bandwidth than prior art is achieved.

Several embodiments are conceivable, for example, so-called re-configurable filters may be used instead of two individual branches, still resulting in two different signal paths.

By coupling a number of such phase shifter devices in series or in parallel, a total phase shifter is obtained, having a resolution that depends on the number of phase shifter devices that are used.

Furthermore, according to another aspect of the invention, the at least two signal paths comprise filters having such characteristics that one signal path essentially lacks bandwidth limitations concerning amplitude and the second signal path has bandwidth limitations concerning amplitude. The presence of limitation in bandwidth is defined as whether a bandwidth of a system in which the phase shifter device is used is affected or not.

This aspect of the present invention allows for a mode of operation where a broad-banded function is acquired and a mode of operation where a narrow-banded function is acquired. This is advantageous during, for example, verification of equipment comprising the phase shifter device.

The invention is not limited to the embodiments described above, but may vary freely within the scope of the appended claims. For example, all the filter configurations for each filter type are only shown as examples. Each filter may of course be realized in many ways not shown here, having more or less components. An example of another all-pass filter 108 is shown in FIG. 15.

Figure 15:
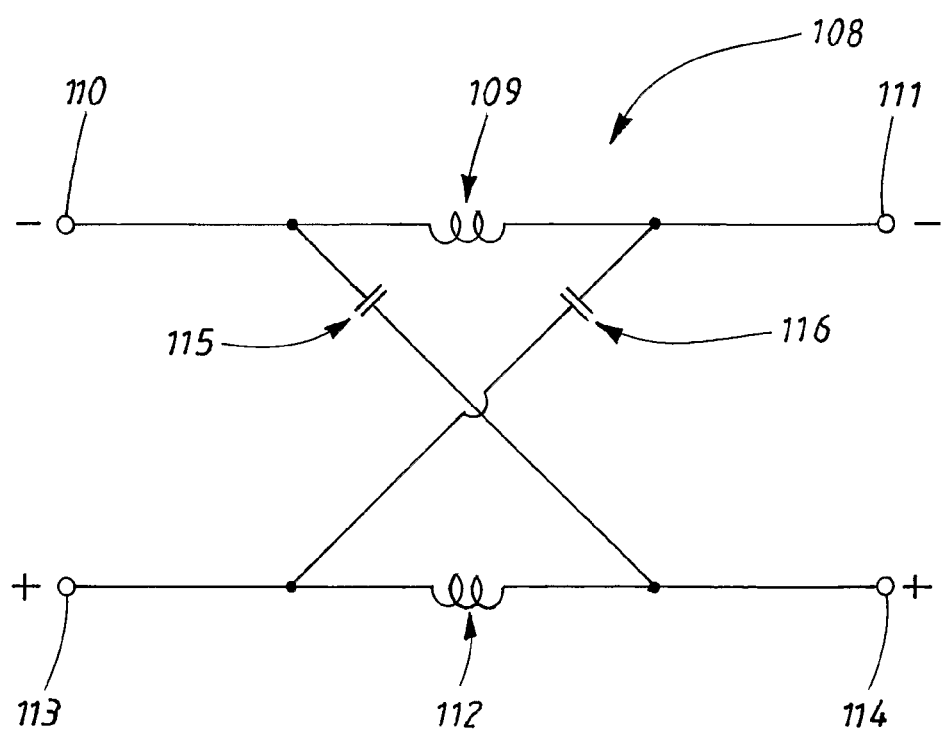
FIG. 15 shows an alternative version of an all-pass filter.

In FIG. 15, the all-pass filter comprises a first inductor 109 connected between a negative (−) input terminal 110 and a negative (−) output terminal 111, and a second inductor 112 connected between a positive (+) input terminal 113 and a positive (+) output terminal 114. The all-pass filter 108 further comprises a first capacitor 115 connected between the negative (−) input terminal 110 and the positive (+) output terminal 114, and a second capacitor 116 connected between the positive (+) input terminal 113 and the negative (−) output terminal 111.

This all-pass filter 108 has an amplitude characteristic similar to the one shown in FIG. 6a, but here the phase characteristics, shown with a dotted line 117 in FIG. 6a, runs from 0° to −180° when the frequency is increased.

As described for the third and fourth embodiment, an all-pass filter is combined with a band-pass filter. It is conceivable that an all-pass filter may be combined with other types of filter, for example a low-pass or a high-pass filter.

Furthermore, instead of serial cascade-coupling of the phase shifter elements in the embodiments shown, parallel coupling (not shown) is also conceivable. Such a parallel coupling is conceivable for all the embodiments described. Parallel coupling may be combined with serial cascade-coupling.

Instead of using band-pass filters in the third and fourth embodiments, at least one of low-pass filters, high-pass filters or band-stop filters may be used.

The invention claimed is:

1. A phase shifter device arranged for altering the electrical length of a signal path between at least two different values, comprising:
    a first signal path, having a first phase and amplitude filter characteristics for varying a frequency of a signal;
    a second signal path, having a second phase and amplitude filter characteristics for varying frequency of the signal,
    means for guiding the signal through at least one of the first signal path and second signal path, wherein the signal is in the form of a differential signal having a positive potential and a negative potential in two different signal conductors, where at least one of said first and second phase and amplitude filter characteristics is realized by means of an all-pass filter; and wherein the other one of the at least first and second phase and amplitude filter characteristics is realized by means of a band-pass filter.

* * * * *

UNITED STATES PATENT AND TRADEMARK OFFICE
CERTIFICATE OF CORRECTION

PATENT NO. : 7,714,681 B2  Page 1 of 1
APPLICATION NO. : 11/915072
DATED : May 11, 2010
INVENTOR(S) : Berg It is certified that error appears in the above-identified patent and that said Letters Patent is hereby corrected as shown below:

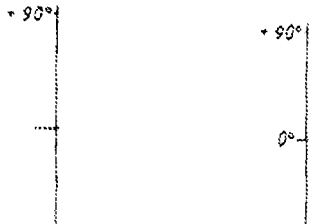

In Fig. 12a, Sheet 6 of 8, delete " " and insert -- --, therefor.

In Column 4, Line 24, delete "alt-pass" and insert -- all-pass --, therefor.

In Column 4, Line 29, delete "fitter is" and insert -- filter is --, therefor.

In Column 5, Line 10, after "DETAILED DESCRIPTION"
insert -- OF THE INVENTION --.

In Column 5, Line 21, delete "(-) 44" and insert -- (-) input terminal 44 --, therefor.

In Column 5, Line 22, delete "(-) 46" and insert -- (-) output terminal 46 --, therefor.

Signed and Sealed this

Seventh Day of September, 2010

David J. Kappos
*Director of the United States Patent and Trademark Office*